(12) United States Patent
Wu et al.

(10) Patent No.: US 10,804,071 B2
(45) Date of Patent: Oct. 13, 2020

(54) TRANSMISSION ELECTRON MICROSCOPE SPECIMEN AND METHOD OF MANUFACTURING THE SAME

(71) Applicant: NATIONAL CHIAO TUNG UNIVERSITY, Hsinchu (TW)

(72) Inventors: Wen-Wei Wu, Hsinchu (TW);
Wei-Huan Tsai, Hsinchu County (TW);
Jui-Yuan Chen, New Taipei (TW);
Cheng-Lun Hsin, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 20 days.

(21) Appl. No.: 16/431,715

(22) Filed: Jun. 4, 2019

(65) Prior Publication Data

US 2020/0027691 A1    Jan. 23, 2020

(30) Foreign Application Priority Data

Jul. 19, 2018 (TW) .............................. 107125009 A

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2003* (2013.01); *H01J 2237/204* (2013.01)

(58) Field of Classification Search
CPC .... H01J 37/20; H01J 37/26; H01J 2237/2003; H01J 2237/204

(Continued)

(56) References Cited

U.S. PATENT DOCUMENTS 8,852,408 B2   10/2014   Chey et al.
9,412,556 B2    8/2016   Khalid et al.
(Continued)

FOREIGN PATENT DOCUMENTS

CN         1635600 A      7/2005
JP      2014025755 A      2/2014
(Continued)

OTHER PUBLICATIONS

Christopher B. Murray, "Watching Nanocrystals Grow," Science, vol. 324, 2009.
(Continued)

*Primary Examiner* — Nicole M Ippolito
(74) *Attorney, Agent, or Firm* — CKC & Partners Co., LLC

(57) ABSTRACT

An electron microscope specimen includes a first electron-transport layer, a second electron-transport layer, a spacer layer, and a carrier layer. The second electron-transport layer has a first opening, a second opening, and a viewing area, wherein the viewing area is between the first opening and the second opening. The spacer layer is sandwiched between the first electron-transport layer and the second electron-transport layer, and the spacer layer has an accommodating space communicating with the first opening and the second opening. The carrier layer is disposed on the second electron-transport layer, and has a viewing window, a first injection hole, and a second injection hole, wherein the viewing window is substantially aligned with the viewing area and the accommodating space, and the first injection hole and the second injection hole respectively communicate with the first opening and the second opening.

18 Claims, 16 Drawing Sheets

(58) Field of Classification Search
USPC ................ 250/440.11, 441.11, 442.11, 443.1
See application file for complete search history.

(56) References Cited

U.S. PATENT DOCUMENTS

| | | | | |
|---|---|---|---|---|
| 2013/0302937 | A1* | 11/2013 | Jinbo | ...................... H01L 21/67 438/99 |
| 2017/0098514 | A1* | 4/2017 | Geohegan | ........... H01L 51/0026 |
| 2018/0211792 | A1* | 7/2018 | Mori | .................... H01G 9/2031 |
| 2020/0106019 | A1* | 4/2020 | Palmstrom | .......... H01L 51/0046 |

FOREIGN PATENT DOCUMENTS

| TW | 200826141 A | 6/2008 |
|---|---|---|
| TW | 201610410 A | 3/2016 |

OTHER PUBLICATIONS

Kuo-Liang Liu et al., "Novel microchip for in situ TEM imaging of living organisms and bio-reactions in aqueous conditions," Lab on a Chip, pp. 1915-1921, 2008.

* cited by examiner

TRANSMISSION ELECTRON MICROSCOPE SPECIMEN AND METHOD OF MANUFACTURING THE SAME

CROSS-REFERENCE TO RELATED APPLICATION

This application claims priority to Taiwan Application Serial Number 107125009, filed Jul. 19, 2018, which is herein incorporated by reference.

BACKGROUND

Field of Invention

The present disclosure relates to an electron microscope specimen, which can be applied to transmission electron microscopy or in-situ transmission electron microscopy.

Description of Related Art

Transmission electron microscopy (TEM) is widely used in materials science because of its high resolution. However, transmission electron microscopy has to work in an ultra-vacuum environment, and as a result, only the structure of the solid phase can be studied.

In-situ transmission electron microscopy (in-situ TEM) can observe general living and liquid samples. For example, in-situ TEM can observe the chemical reaction process in a solution directly. Therefore, in-situ TEM can be applied in biomedical, chemical and interface sciences. The current liquid observation specimen applied to transmission electron microscopy is packaged in a multi-layer assembly. For example, a liquid sample is injected into a spacer layer (e.g., Indium) and its top and bottom are covered by two components to carry out packaging. However, such a multi-layer assembly increases the thickness of the specimen, and the large package area results in disadvantages such as decreasing sealability. Accordingly, there is a need for a novel liquid specimen applied to transmission electron microscopy which solves the above problems.

SUMMARY

In accordance with an aspect of the present disclosure, an electron microscope specimen is provided. The electron microscope specimen includes a first electron-transport layer, a second electron-transport layer, a spacer layer, and a carrier layer. The second electron-transport layer has a first opening, a second opening, and a viewing area, wherein the viewing area is between the first opening and the second opening. The spacer layer is sandwiched between the first electron-transport layer and the second electron-transport layer, and the spacer layer has an accommodating space communicating with the first opening and the second opening. The carrier layer is disposed on the second electron-transport layer, and has a viewing window, a first injection hole, and a second injection hole, wherein the viewing window is substantially aligned with the viewing area and the accommodating space, and the first injection hole and the second injection hole respectively communicate with the first opening and the second opening.

According to some embodiments of the present disclosure, each of the first electron-transport layer and the second electron-transport layer includes $Si_3N_4$.

According to some embodiments of the present disclosure, each of the first electron-transport layer and the second electron-transport layer has a thickness of about 40-80 nm, respectively.

According to some embodiments of the present disclosure, the spacer layer includes silicon (Si).

According to some embodiments of the present disclosure, the spacer layer has a thickness of about 50-200 nm.

According to some embodiments of the present disclosure, the viewing window has a width of about 50-100 μm and a length of about 50-100 μm.

According to some embodiments of the present disclosure, each of the first injection hole and the second injection hole has a length of about 140-200 μm and a width of about 80-100 μm.

According to some embodiments of the present disclosure, a distance between the first injection hole and the second injection hole is about 150-750 μm.

According to some embodiments of the present disclosure, the transmission electron microscope specimen has a thickness of about 170-600 μm.

According to some embodiments of the present disclosure, the carrier layer includes a first etching stop layer, a substrate, a second etching stop layer, and a patterned mask layer. The first etching stop layer is disposed on the second electron-transport layer. The substrate is disposed on the first etching stop layer. The second etching stop layer is disposed on the substrate. The patterned mask layer is disposed on the second etching stop layer, wherein the viewing window, the first injection hole, and the second injection hole penetrate the first etching stop layer, the substrate, the second etching stop layer, and the patterned mask layer.

According to some embodiments of the present disclosure, the substrate includes silicon.

According to some embodiments of the present disclosure, each of the first etching stop layer and the second etching stop layer includes $SiO_2$.

In accordance with another aspect of the present disclosure, a method of manufacturing the electron microscope specimen is provided. The method includes forming a first etching stop layer on a first surface of the substrate; forming a first patterned electron-transport membrane on the first etching stop layer, wherein the first patterned electron-transport membrane has a first opening and a second opening exposing the first etching stop layer; forming a spacer layer on the first patterned electron-transport membrane and covering the first opening and the second opening; forming a second electron-transport membrane on the spacer layer; etching the substrate and the first etching stop layer to form a viewing window, a first injection hole, and a second injection hole, wherein the first injection hole and the second injection hole are respectively aligned with and communicate with the first opening and the second opening, and the viewing window is between the first injection hole and the second injection hole; and etching the spacer layer to form an accommodating space between the first patterned electron-transport membrane and the second electron-transport membrane, wherein the accommodating space communicates with the first injection hole and the second injection hole.

According to some embodiments of the present disclosure, before etching the substrate and the first etching stop layer, the method further includes forming a second etching stop layer on a second surface of the substrate, wherein the first surface and the second surface are respectively on opposite sides of the substrate; and forming a patterned mask layer on the second etching stop layer, wherein the patterned mask layer has a third opening, a fourth opening, and a fifth opening exposing the second etching stop layer, the third opening and the fourth opening are respectively aligned with the second opening and the first opening, and the fifth opening is disposed between the third opening and the fourth opening.

According to some embodiments of the present disclosure, etching the substrate and the first etching stop layer includes etching the second etching stop layer, the substrate, and the first etching stop layer from the third opening, the fourth opening, and the fifth opening of the patterned mask layer to form the first injection hole, the second injection hole, and the viewing window.

According to some embodiments of the present disclosure, etching the substrate and the first etching stop layer includes etching the substrate using $C_4F_8$ and $SF_6$; and etching the first etching stop layer using $CHF_3/O_2$.

According to some embodiments of the present disclosure, etching the spacer layer includes hydrophilic treating the transmission electron microscope specimen; and etching the spacer layer through the first injection hole and the second injection hole using KOH to form the accommodating space.

According to some embodiments of the present disclosure, a distance between the first injection hole and the second injection hole is about 150-750 μm.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
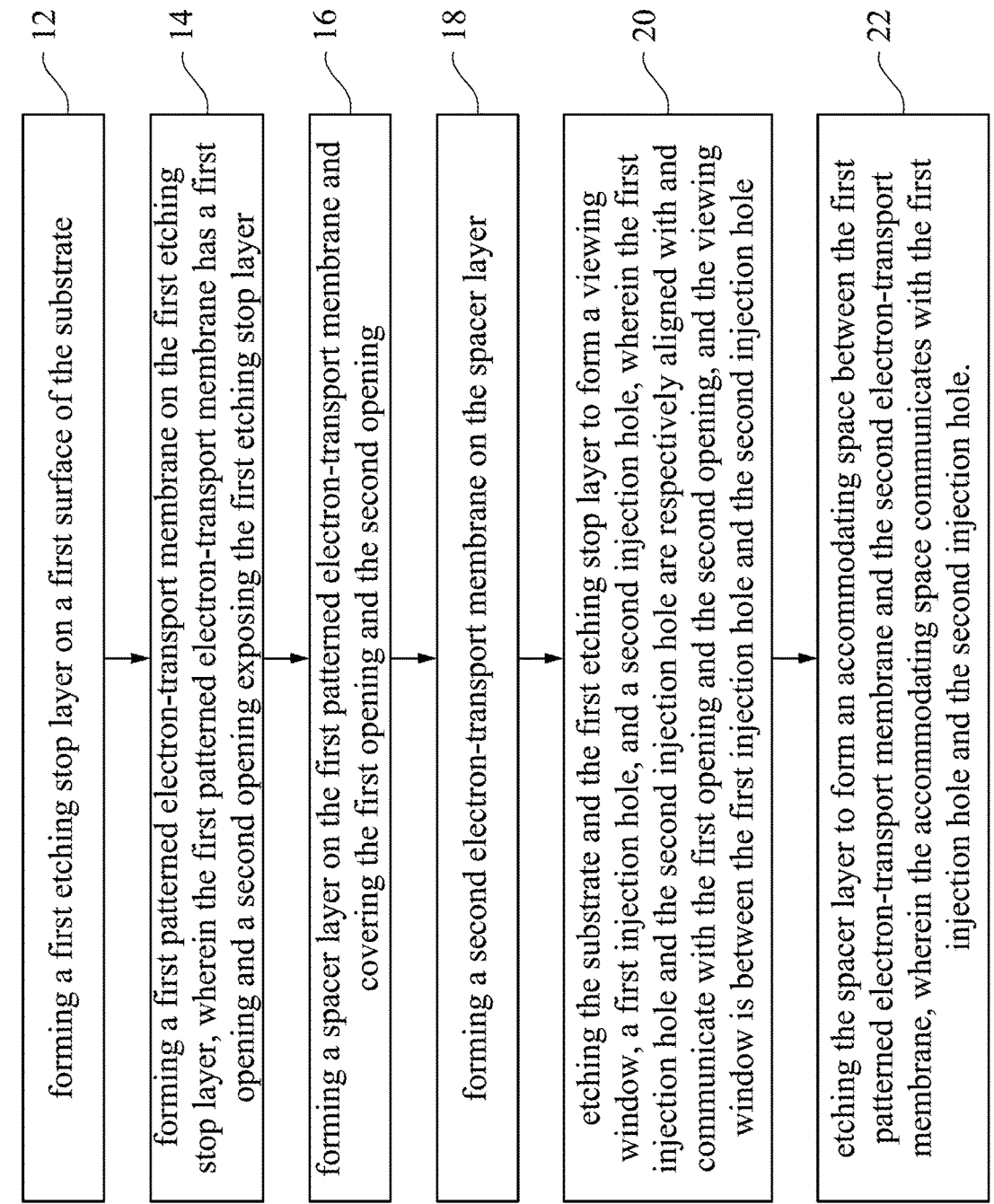
FIG. 1 is a flow chart illustrating a method of manufacturing a transmission electron microscope specimen in accordance with various embodiments of this disclosure.

Reference will now be made in detail to the present embodiments of the disclosure, examples of which are illustrated in the accompanying drawings. Wherever possible, the same reference numbers are used in the drawings and the description to refer to the same or like parts.

Furthermore, spatial relative terms, such as "below," "under," "above," "over," etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over." Furthermore, the spatial relative narratives used herein should be interpreted the same.

Although the use of a series of actions or steps are described in the method below, the described order of these actions or steps should not be construed to limit the present disclosure. For example, certain actions or steps may be performed in different orders and/or concurrently with other steps. Moreover, not all steps must be performed in order to achieve the depicted embodiment of the present disclosure. Furthermore, each operation or procedure described herein may contain several sub-steps or actions.

FIG. 1 is a flow chart illustrating a method 10 of manufacturing a transmission electron microscope specimen 1000 in accordance with various embodiments of this disclosure. As shown in FIG. 1, the method 10 includes operations 12, 14, 16, 18, 20 and 22. FIGS. 2-12 are perspective views of various intermediary stages in the manufacturing of a transmission electron microscope specimen 1000 in accordance with the method 10 of FIG. 1.

Figure 2:
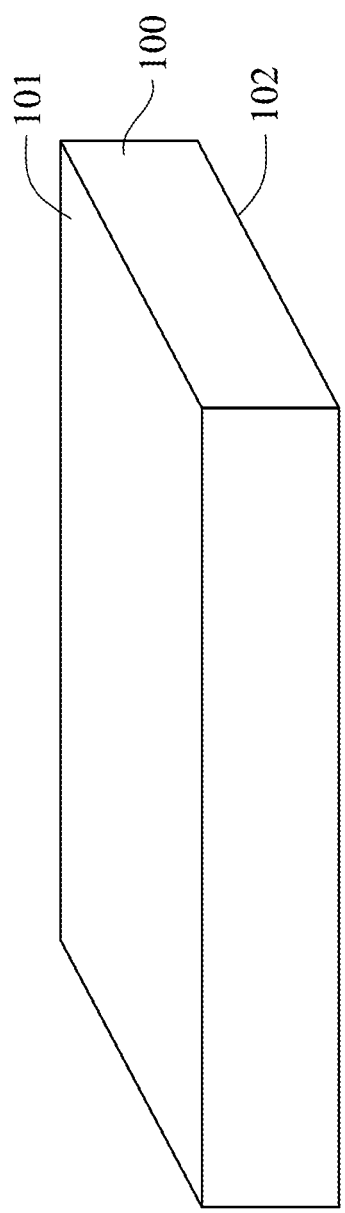
FIGS. 2-14 are perspective views of various intermediary stages in the manufacturing of a transmission electron microscope specimen in accordance with various embodiments of this disclosure.
Figure 3:
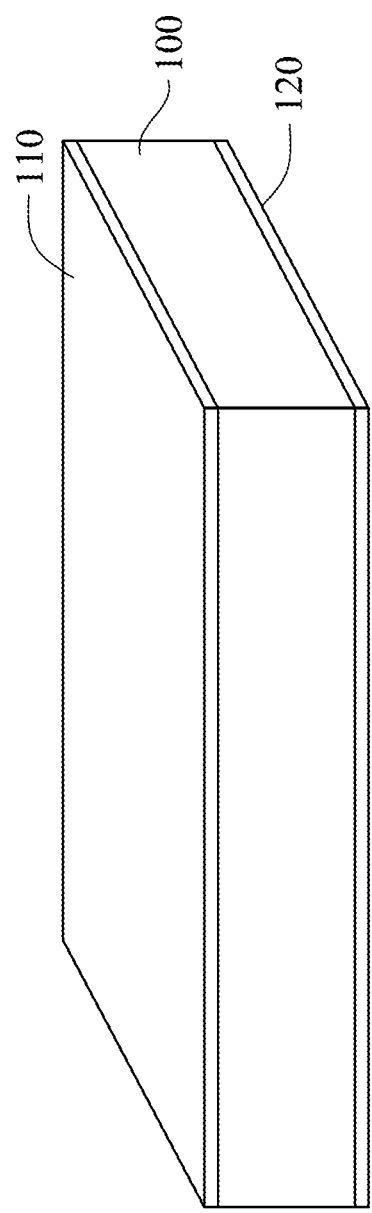

Referring to FIGS. 1-3, in the operation 12 of the method 10, a first etching stop layer 110 is formed on a first surface 101 of a substrate 100. In various embodiments, the substrate 100 may include, but is not limited to, silicone (Si). In some embodiments, the substrate 100 may be a silicon wafer. In various embodiments, the first etching stop layer 110 includes, but is not limited to, silicon dioxide ($SiO_2$). In some embodiments, the material of the first etching stop layer 110 and the substrate 100 may be selected to have a larger etching selectivity than the material of a subsequently formed first patterned electron-transport membrane 132 (see FIG. 5). The first etching stop layer 110 can be formed by any suitable method. In some embodiments, the first etching stop layer 110 may be formed by a thermal oxidation process, such as a wet oxidation process. In other embodiments, the first etching stop layer 110 may be formed by chemical vapor deposition (CVD), such as low pressure chemical vapor deposition (LPCVD), plasma enhanced chemical vapor deposition (PECVD), or high density plasma chemical vapor deposition (HDPCVD), or by physical vapor deposition (PVD). In some embodiments, oxide, metal particles, and other contaminants on the substrate 100 may be removed by RCA cleaning before forming the first etching stop layer 110.

With continued reference to FIGS. 1-3, in some embodiments, the operation 12 may further include forming a second etching stop layer 120 on a second surface 102 of the substrate 100. The first surface 101 and the second surface 102 are on opposite sides of the substrate 100 (as best shown in FIG. 2). In some embodiments, the second etching stop layer 120 is formed simultaneously with the first etching stop layer 110 in the operation 12. More specifically, the second etching stop layer 120 may include the same material and involve the same formation method as the first etching stop layer 110. In other embodiments, the second etching stop layer 120 may be omitted.

Figure 4:
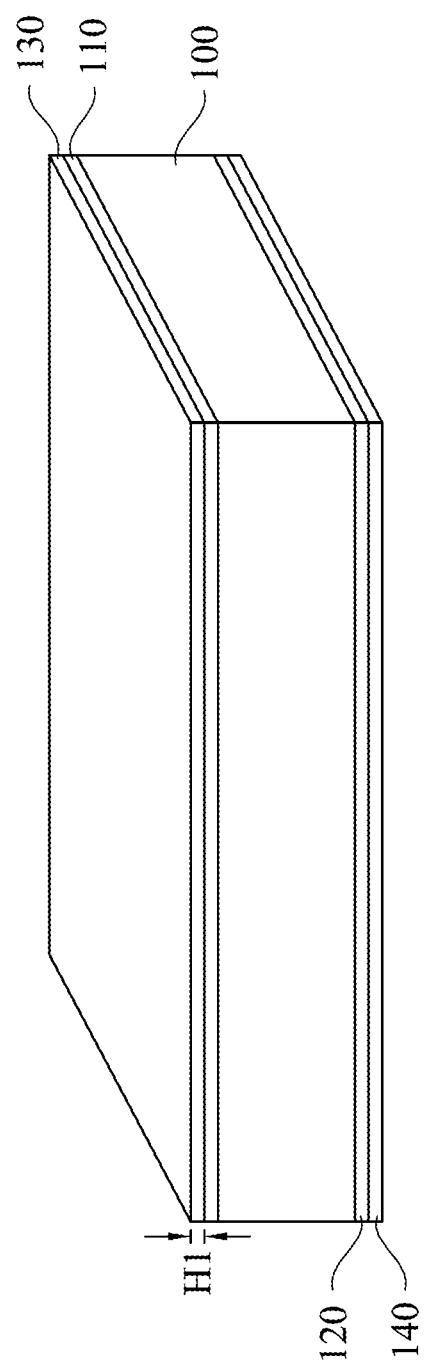
Figure 5:
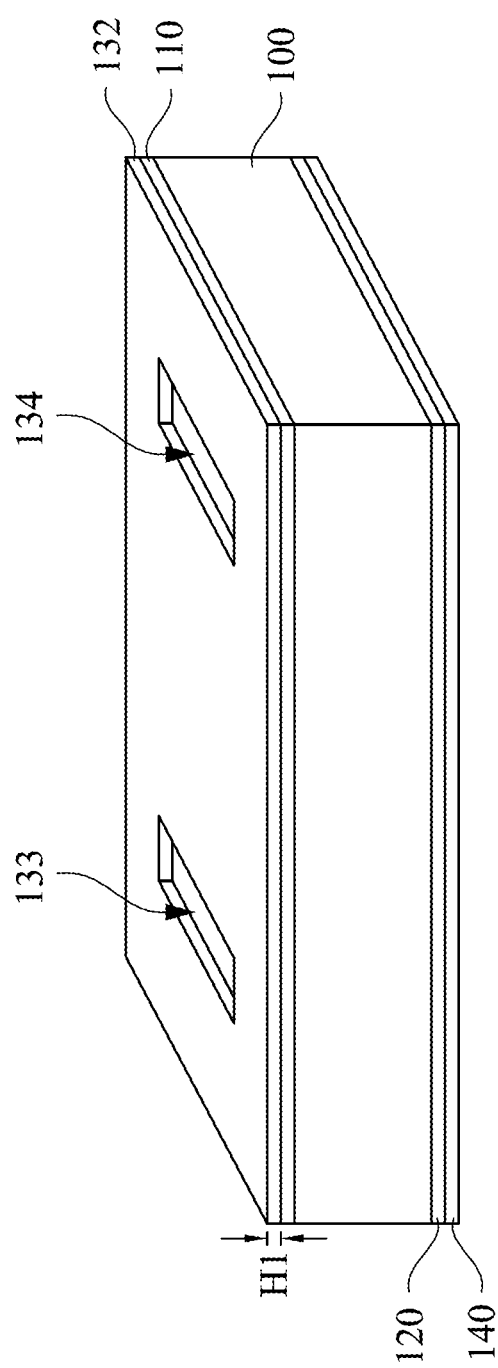

Referring to FIG. 1 and FIGS. 4-5, in the operation 14 of the method 10, the first patterned electron-transport membrane 132 is formed on the first etching stop layer 110, wherein the first patterned electron-transport membrane 132 has a first opening 133 and a second opening 134 exposing the first etching stop layer 110. Forming the first patterned electron-transport membrane 132 may include depositing a first electron-transport membrane 130 (shown in FIG. 4) on the first etching stop layer 110, followed by exposure and development processes. After confirming the pattern with an optical microscope, the first patterned electron-transport membrane 132 is formed by a suitable etching process, such as dielectric material RIE (reactive-ion etching). In various embodiments, the first patterned electron-transport membrane 132 includes, but is not limited to, $Si_3N_4$. In some embodiments, the first patterned electron-transport membrane 132 has a thickness H1 of about 40-80 nm, for example, about 45, 47, 48, 50, 53, 55, 57, 60, 62, 65, 67, 70, 72, or 75 nm. The thickness H1 of the first patterned electron-transport membrane 132 should be such to allow the electron beam to penetrate during observation.

In some embodiments, the operation 14 may further include forming a mask layer 140 under the second etching stop layer 120. In some embodiments, the mask layer 140 may be formed simultaneously with the first electron-transport membrane 130. In some embodiments, the mask layer 140 may include the same material and involve the same formation method as the first electron-transport membrane 130.

Figure 6:
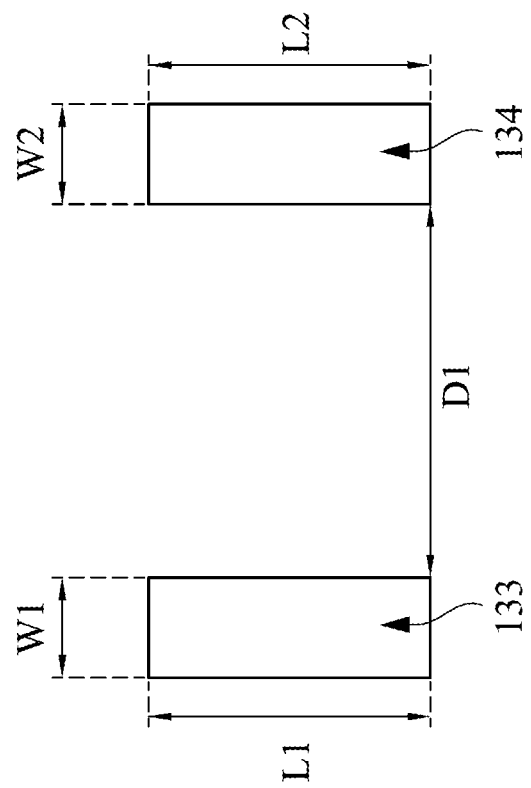

Reference is made to FIG. 5 and FIG. 6. FIG. 6 is a top view of the first opening 133 and the second opening 134 of FIG. 5. In various embodiments, a distance D1 between the first opening 133 and the second opening 134 is about 150-750 μm, for example, about 160, 165, 170, 175, 180, 185, 190, 195, 200, 205, 210, 215, 230, 240, 250, 260, 270, 280, 290, 300, 310, 330, 350, 370, 390, 400, 450, 500, 550, 600, 650, or 700 μm. In various embodiments, the first opening 133 has a length L1, the second opening 134 has a length L2, and each of the length L1 and the length L2 is about 140-200 μm, for example, about 145, 150, 155, 158, 160, 162, 165, 167, 170, 173, 175, 180, 183, 185, 190, 192, 195, or 197 μm. In some embodiments, the length L1 of the first opening 133 may be the same as the length L2 of the second opening 134. In other embodiments, the length L1 of the first opening 133 may be different from the length L2 of the second opening 134. In various embodiments, the first opening 133 has a width W1, the second opening 134 has a width W2, and each of the width W1 and the width W2 is about 80-100 μm, for example, about 85, 87, 90, 95, or 98 μm. In some embodiments, the width W1 of the first opening 133 may be the same as the width W2 of the second opening 134. In other embodiments, the width W1 of the first opening 133 may be different from the width W2 of the second opening 134. In some examples, the distance D1 between the first opening 133 and the second opening 134 is about 200 μm, each of the length L1 of the first opening 133 and the length L2 of the second opening 134 is about 200 μm, and each of the widths W1 and W2 is about 100 μm. It should be understood that the first opening 133 and the second opening 134 of this disclosure are not limited to FIG. 6, and the shape and size of the openings may be selected depending on the need.

Figure 7:
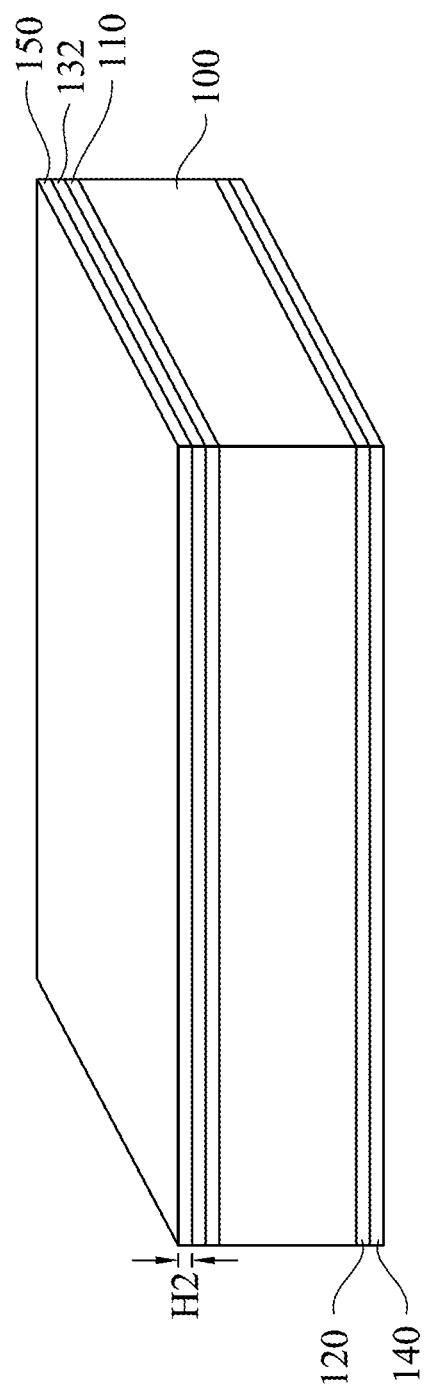

Referring to FIG. 1 and FIG. 7, in the operation 16 of the method 10, a spacer layer 150 is formed on the first patterned electron-transport membrane 132 and covers the first opening 133 and the second opening 134. In various embodiments, the spacer layer 150 includes, but is not limited to, silicone (Si). In some embodiments, the spacer layer 150 has a thickness H2 of about 50-200 nm, for example, about 55, 60, 65, 70, 75, 80, 85, 90, 100, 110, 120, 130, 140, 150, 160, 170, 180, or 190 nm. The spacer layer 150 is etched in a subsequent process to form an accommodating space 152 (see FIG. 14) for accommodating a sample (e.g., a liquid or a living sample), and therefore, the thickness H2 of the spacer layer 150 can be selected depending on the type and volume of the sample to be tested. Using silicon or other inert metal as the spacer layer 150 to accommodate a liquid sample can reduce the possibility that the sample reacts with the spacer layer 150, such that the type of the sample to be tested will not be restricted.

Figure 8:
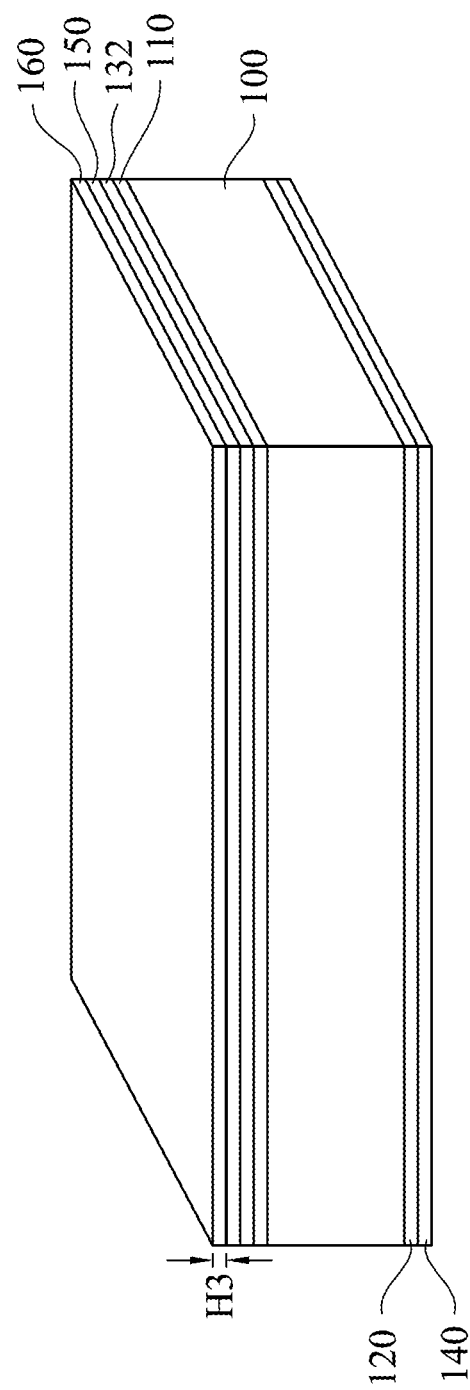

Referring to FIG. 1 and FIG. 8, in the operation 18 of the method 10, a second electron-transport membrane 160 is formed on the spacer layer 150. In various embodiments, the second electron-transport membrane 160 may include, but is not limited to, $Si_3N_4$. In some embodiments, the second electron-transport membrane 160 may include the same material and involve the same formation method as the first electron-transport membrane 130 (see FIG. 4). In some embodiments, the second electron-transport membrane 160 has a thickness H3 of about 40-80 nm, for example, about 45, 47, 48, 50, 53, 55, 57, 60, 62, 65, 67, 70, 72, or 75 nm. In some embodiments, the thickness H3 of the second electron-transport membrane 160 may be the same as the thickness H1 of the first electron-transport membrane 130. In some embodiments, the thickness H3 of the second electron-transport membrane 160 may be different from the thickness H1 of the first electron-transport membrane 130. The thickness H3 of the second electron-transport membrane 160 should be such to allow the electron beam to penetrate during observation.

Figure 9:
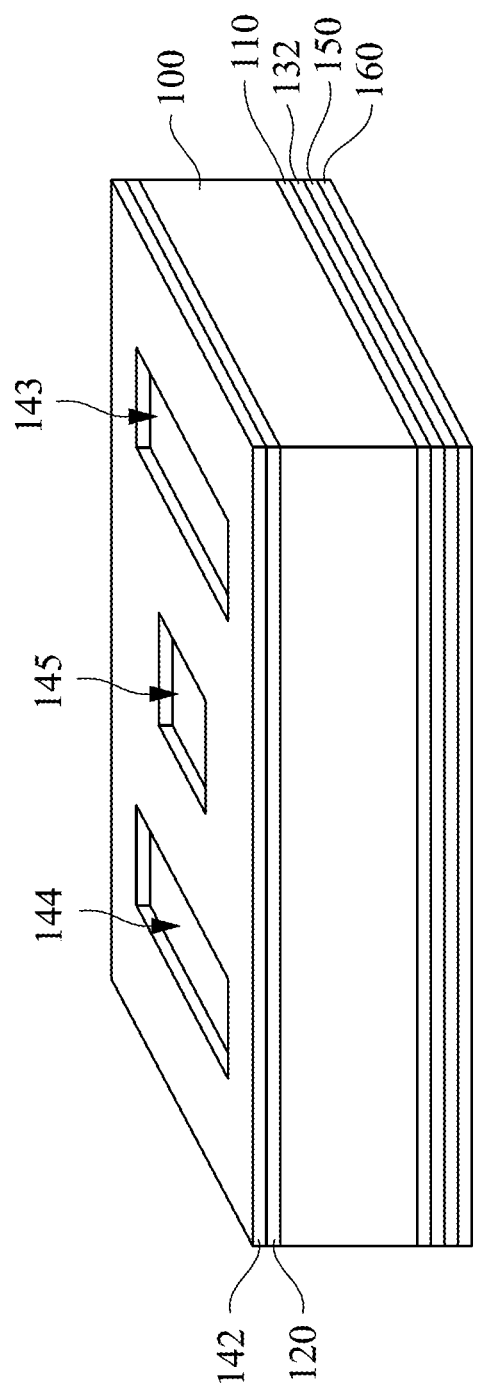

Reference is made to FIG. 9. For the convenience of description, FIG. 9 is a schematic view showing the structure shown in FIG. 8 turned upside down. In some embodiments, after operation 18, a patterned mask layer 142 may be formed on the second etching stop layer 120 from the mask layer 140 (see FIG. 4), wherein the patterned mask layer 142 has a third opening 143, a fourth opening 144, and a fifth opening 145 exposing the second etching stop layer 120. In some embodiments, the method of forming the patterned mask layer 142 may be the same as the method of forming the first patterned electron-transport membrane 132.

Figure 10:
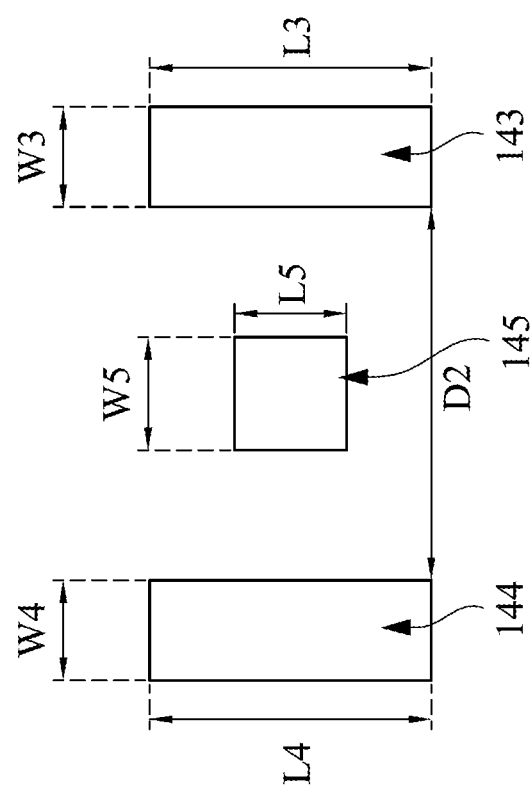

Reference is made to FIG. 9 and FIG. 10. FIG. 10 is a top view of the third opening 143, the fourth opening 144, and the fifth opening 145 of FIG. 9. The fifth opening 145 is between the third opening 143 and the fourth opening 144. The third opening 143 and the fourth opening 144 of the patterned mask layer 142 are respectively aligned with the first opening 133 and the second opening 134 of the first patterned electron-transport membrane 132 in the vertical direction. In some embodiments, the shapes, the sizes, and the configurations of the third opening 143 and the fourth opening 144 respectively correspond to the first opening 133 and the second opening 134.

In various embodiments, a distance D2 between the third opening 143 and the fourth opening 144 is about 150-750 μm, for example, about 160, 165, 170, 175, 180, 185, 190, 195, 200, 205, 210, 215, 230, 240, 250, 260, 270, 280, 290, 300, 310, 330, 350, 370, 390, 400, 450, 500, 550, 600, 650, or 700 μm. In some embodiments, the third opening 143 has a length L3, the fourth opening 144 has a length L4, and each of the length L3 and length L4 is about 140-200 μm, for example, about 145, 150, 155, 158, 160, 162, 165, 167, 170, 173, 175, 180, 183, 185, 190, 192, 195, or 197 μm. In various embodiments, the third opening 143 has a width W3, the fourth opening 144 has a width W4, and each of the width W3 and W4 is about 80-100 μm, for example, about 85, 87, 90, 95, or 98 μm. In some embodiments, the fifth opening 145 has a length L5 of about 50-100 μm, for example, about 55, 60, 65, 70, 75, 80, 85, 90, or 95 μm. In some embodiments, the fifth opening 145 has a width W5 of about 50-100 μm, for example, about 55, 60, 65, 70, 75, 80, 85, 90, or 95 μm. The shapes of the third opening 143, fourth opening 144, and the fifth opening 145 illustrated in FIG. 10 are only examples, and this disclosure is not limited thereto. A suitable shape and size of the openings may be selected according to the need.

Figure 11:
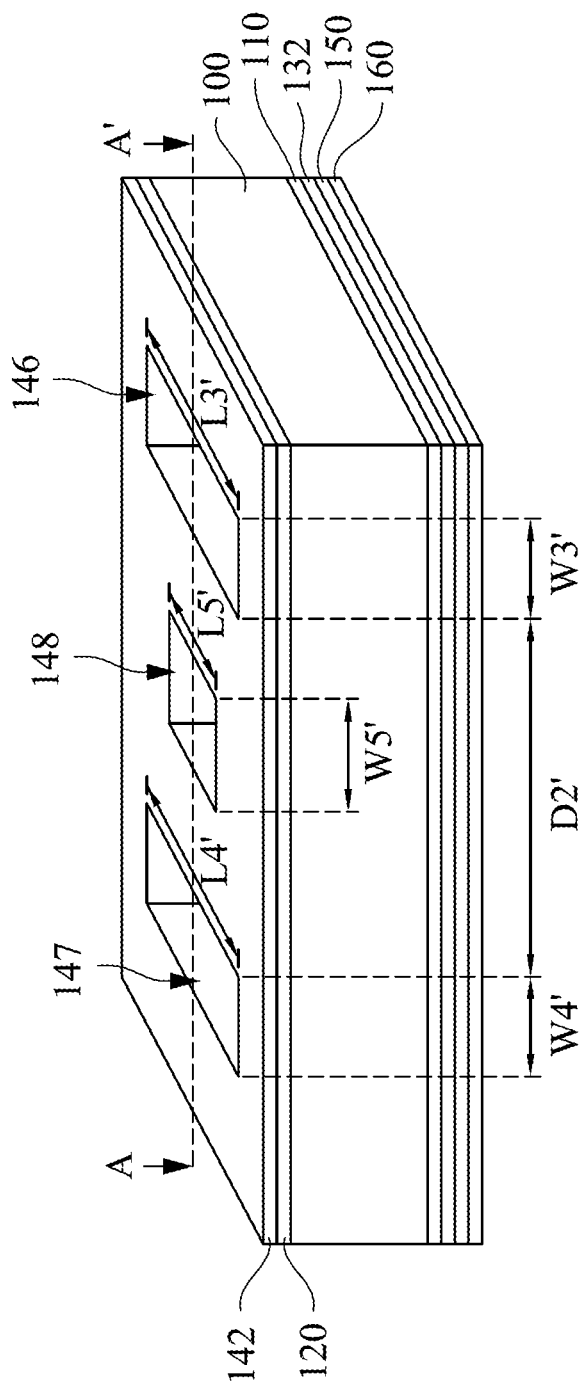
Figure 12:
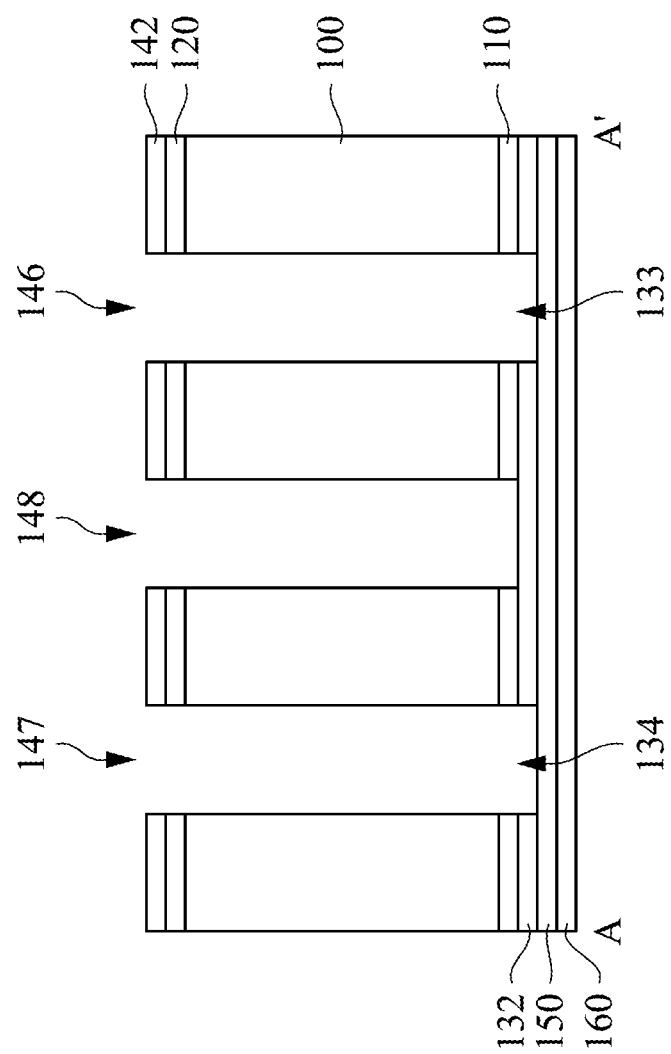

Referring to FIG. 1 and FIGS. 11-12, in the operation 20 of the method 10, the substrate 100 and the first etching stop layer 110 are etched to form a first injection hole 146, a second injection hole 147, and a viewing window 148. In some embodiments, the operation 20 may further include etching the second etching stop layer 120, the substrate 100, and the first etching stop layer 110 from the third opening 143, the fourth opening 144, and the fifth opening 145 of the patterned mask layer 142. In some examples, the first etching stop layer 110 and the second etching stop layer 120 may be etched by $CHF_3/O_2$. In some examples, the substrate 100 may be etched by $C_4F_8$ and $SF_6$.

FIG. 12 is a cross-sectional view taken along line A-A of FIG. 11. As shown in FIG. 12, the viewing window 148 is between the first injection hole 146 and the second injection hole 147, and the first injection hole 146 and the second injection hole 147 are respectively aligned with and communicate with the first opening 133 and the second opening 134 of the first patterned electron-transport membrane 132. In various embodiments, the shapes and the configurations of the first injection hole 146, the second injection hole 147, and the viewing window 148 respectively correspond to the third opening 143, the fourth opening 144, and the fifth opening 145 of the patterned mask layer 142. In some embodiments, as shown in FIG. 11, a length L3' and a width W3' of the first injection hole 146, a length L4' and a width W4' of the second injection hole 147, and a length L5' and a width W5' of the viewing window 148 are the same as the length L3 and the width W3 of the third opening 143, the length L4 and the width W4 of the fourth opening 144, and the length L5 and the width W5 of the fifth opening 145, respectively (see FIG. 10). Further, in some embodiments, a distance D2' between the first injection hole 146 and the second injection hole 147 is also the same as the distance D2 between the third opening 143 and the fourth opening 144 (see FIG. 10). More specifically, in some embodiments, the first injection hole 146 and the second injection hole 147 may extend to the first opening 133 and the second opening 134 through the third opening 143 and the fourth opening 144, respectively (see FIG. 9). The viewing window 148 may extend through the fifth opening 145 (see FIG. 9), and expose the first patterned electron-transport membrane 132.

Figure 13:
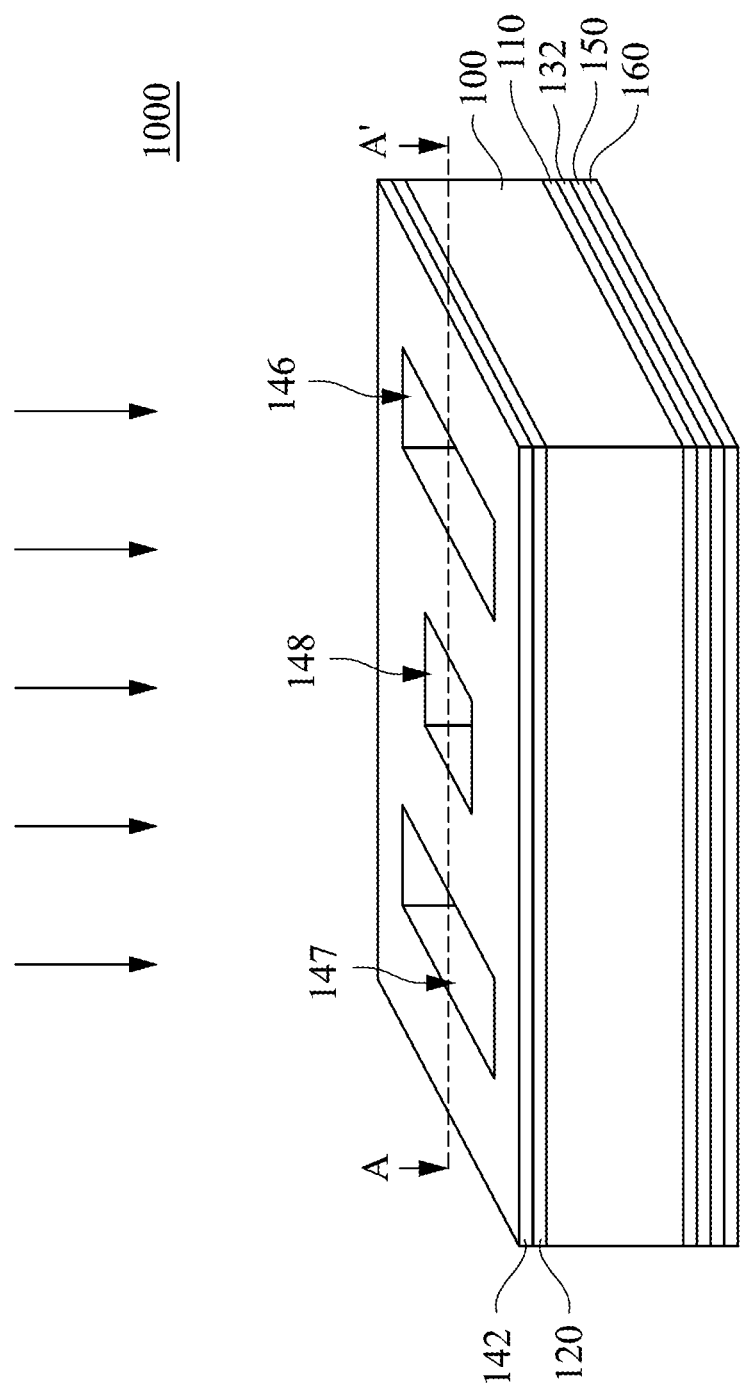
Figure 14:
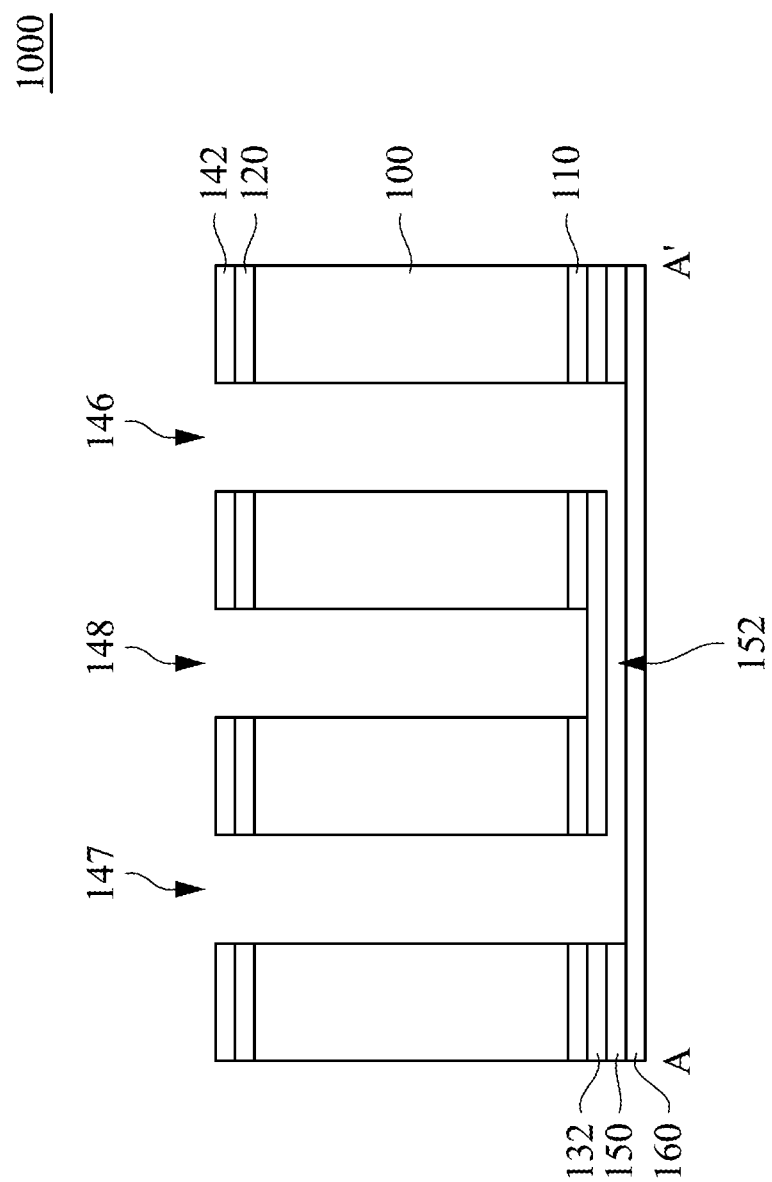

Referring to FIG. 1 and FIGS. 13-14, in the operation 22 of the method 10, the spacer layer 150 is etched to form the accommodating space 152 (shown in FIG. 14) between the first patterned electron-transport membrane 132 and the second electron-transport membrane 160, wherein the accommodating space 152 communicates with the first injection hole 146 and the second injection hole 147. In some embodiments, the operation 22 may further include hydrophilic treating the transmission electron microscope specimen shown in FIG. 11, and etching the spacer layer 150 through the first injection hole 146 and the second injection hole 147 by KOH to form the accommodating space 152. The hydrophilic treatment can reduce the surface tension or wetting angle of the first injection hole 146 and the second injection hole 147. Therefore, when the liquid sample is injected, it can easily flow into the accommodating space 152 from the first injection hole 146 and the second injection hole 147 without being stuck on the wall of the holes.

Figure 15:
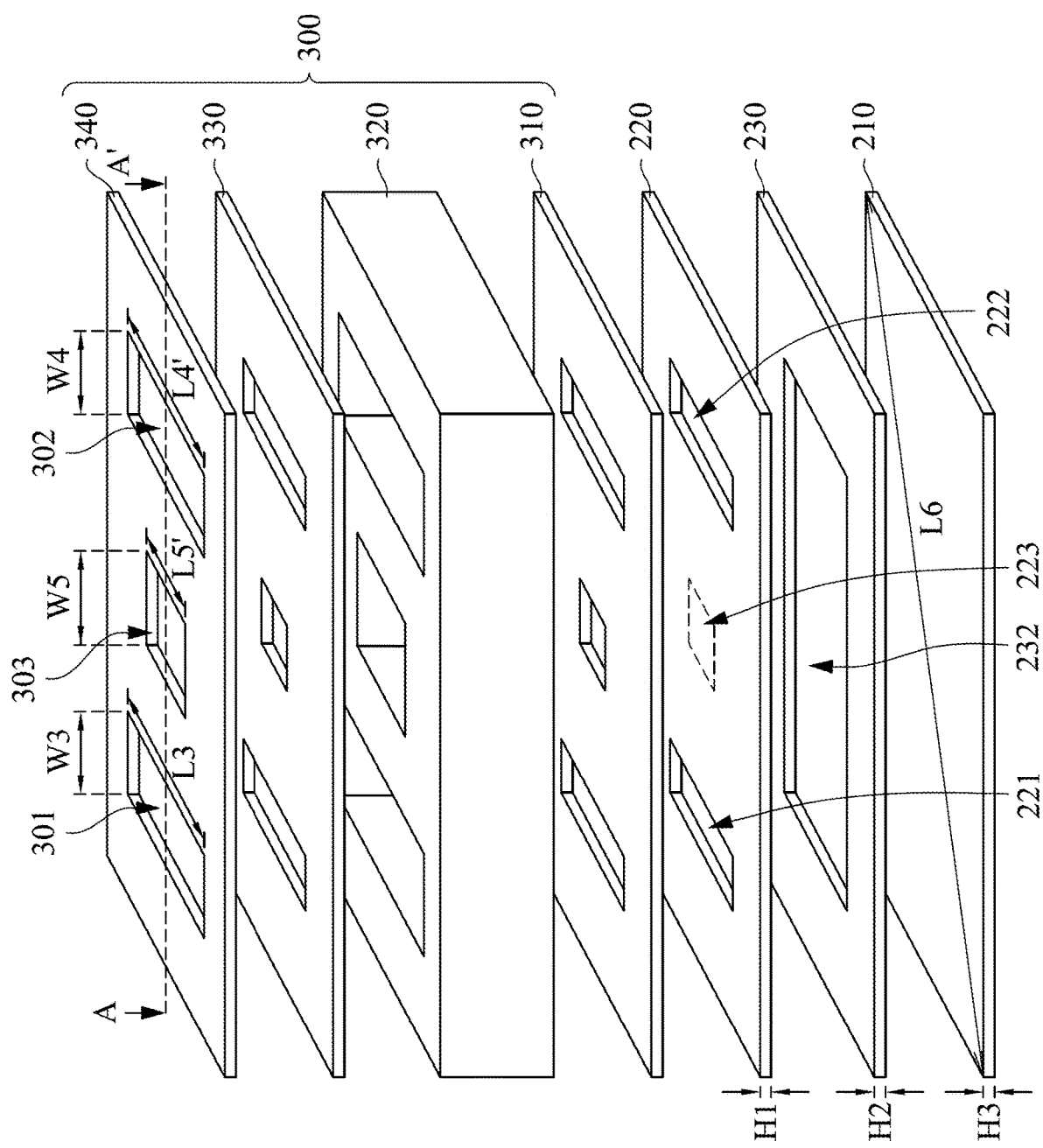
FIG. 15 is an exploded schematic diagram of a transmission electron microscope specimen in accordance with various embodiments of this disclosure.

FIG. 15 is an exploded schematic diagram of a transmission electron microscope specimen 2000 in accordance with various embodiments of this disclosure. The transmission electron microscope specimen 2000 includes a first electron-transport layer 210, a second electron-transport layer 220, a spacer layer 230, and a carrier layer 300. The components having similar or identical names in the transmission electron microscope specimen 1000 shown in FIG. 13 and the transmission electron microscope specimen 2000 shown in FIG. 15 may include the same material, and a description in this regard will not be repeated hereafter. The transmission electron microscope specimen 2000 may further include other components, which will be described below.

In some embodiments, the first electron-transport layer 210 and the second electron-transport layer 220 have thicknesses H3 and H1, respectively, and each of the thicknesses H3 and H1 is about 40-80 nm. The second electron-transport layer 220 has a first opening 221, a second opening 222, and a viewing area 223 (indicated by the dotted line in FIG. 15), and the viewing area 223 is between the first opening 221 and the second opening 222.

The spacer layer 230 is disposed between the first electron-transport layer 210 and the second electron-transport layer 220. As shown in FIG. 15, the spacer layer 230 has an accommodating space 232, and the accommodating space 232 communicates with the first opening 221 and the second opening 222. In some embodiments, the spacer layer 230 has a thickness H2 of about 50-200 nm. The accommodating space 232 can accommodate the sample, and is surrounded by the spacer layer 230, the first electron-transport layer 210, and the second electron-transport layer 220. The thickness H2 of the spacer layer 230 corresponds to the height of the accommodating space 232, which will affect the volume of the sample to be accommodated. Therefore, a suitable thickness H2 can be selected depending on the type of the sample to be tested.

The carrier layer 300 is disposed on the second electron-transport layer 220, and has a viewing window 303, a first injection hole 301, and a second injection hole 302. The viewing window 303 is substantially aligned with the viewing area 223 and the accommodating space 232. The first injection hole 301 and the second injection hole 302 communicate with the first opening 221 and the second opening 222, respectively. In some embodiments, a thickness H4 (shown in FIG. 16) of the carrier layer 300 may be greater than the thickness of any one of the first electron-transport layer 210, the second electron-transport layer 220, and the spacer layer 230, so as to allow the transmission electron microscope specimen 2000 to be easily placed into a carrier of a transmission electron microscope. In some embodiments, the transmission electron microscope specimen 2000 has a thickness H5 (shown in FIG. 16) of about 170-600 μm, for example, about 175, 180, 185, 190, 195, 200, 205, 210, 215, 220, 225, 230, 235, 240, 245, 250, 255, 260, 270, 280, 290, 300, 315, 330, 345, 360, 375, 390, 400, 420, 440, 460, 480, 500, 520, 540, 560, or 580 μm. In some examples, the thickness H5 of the transmission electron microscope specimen 2000 is preferably not more than 250 μm. The whole transmission electron microscope specimen 2000 has a uniform thickness. Therefore, the transmission electron microscope specimen 2000 of the present disclosure can be placed in a carrier of various types of electron microscopes on the market, and does not require the use of a specific carrier.

In some embodiments, the carrier layer 300 may further include a first etching stop layer 310, a substrate 320, a second etching stop layer 330, and a patterned mask layer 340. As shown in FIG. 15, the first etching stop layer 310 is disposed on the second electron-transport layer 220, the substrate 320 is disposed on the first etching stop layer 310, the second etching stop layer 330 is disposed on the substrate 320, and the patterned mask layer 340 is disposed on the second etching stop layer 330. The first injection hole 301, the second injection hole 302, and the viewing window 303 of the carrier layer 300 penetrate the first etching stop layer 310, the substrate 320, the second etching stop layer 330, and the patterned mask layer 340. In some embodiments, the width W5 of the viewing window 303 is about 50-100 µm, and the length L5 of the viewing window 303 is about 50-100 µm. In some embodiments, the first injection hole 301 and the second injection hole 302 have lengths L3 and L4, respectively, of about 140-200 µm, and widths W3 and W4 of about 80-100 µm. In some embodiments, the distance D2 between the first injection hole 301 and the second injection hole 302 is about 150-750 µm. In some embodiments, a diagonal length L6 of the transmission electron microscope specimen 2000 is about 1-3 mm. This length L6 conforms to the diameter of the specimen that can be accommodated by carrier of the electron microscope on the market. Therefore, the transmission electron microscope specimen 2000 of the present disclosure can be applied to various types of electron microscopes on the market.

It should be understood that FIG. 15 illustrates the components of the transmission electron microscope specimen 2000 in separate layers for the sake of describing the structures of each of the components of the transmission electron microscope specimen 2000 clearly. In an actual application, the transmission electron microscope specimen 2000 is integrally formed, and each layer is inseparable.

Figure 16:
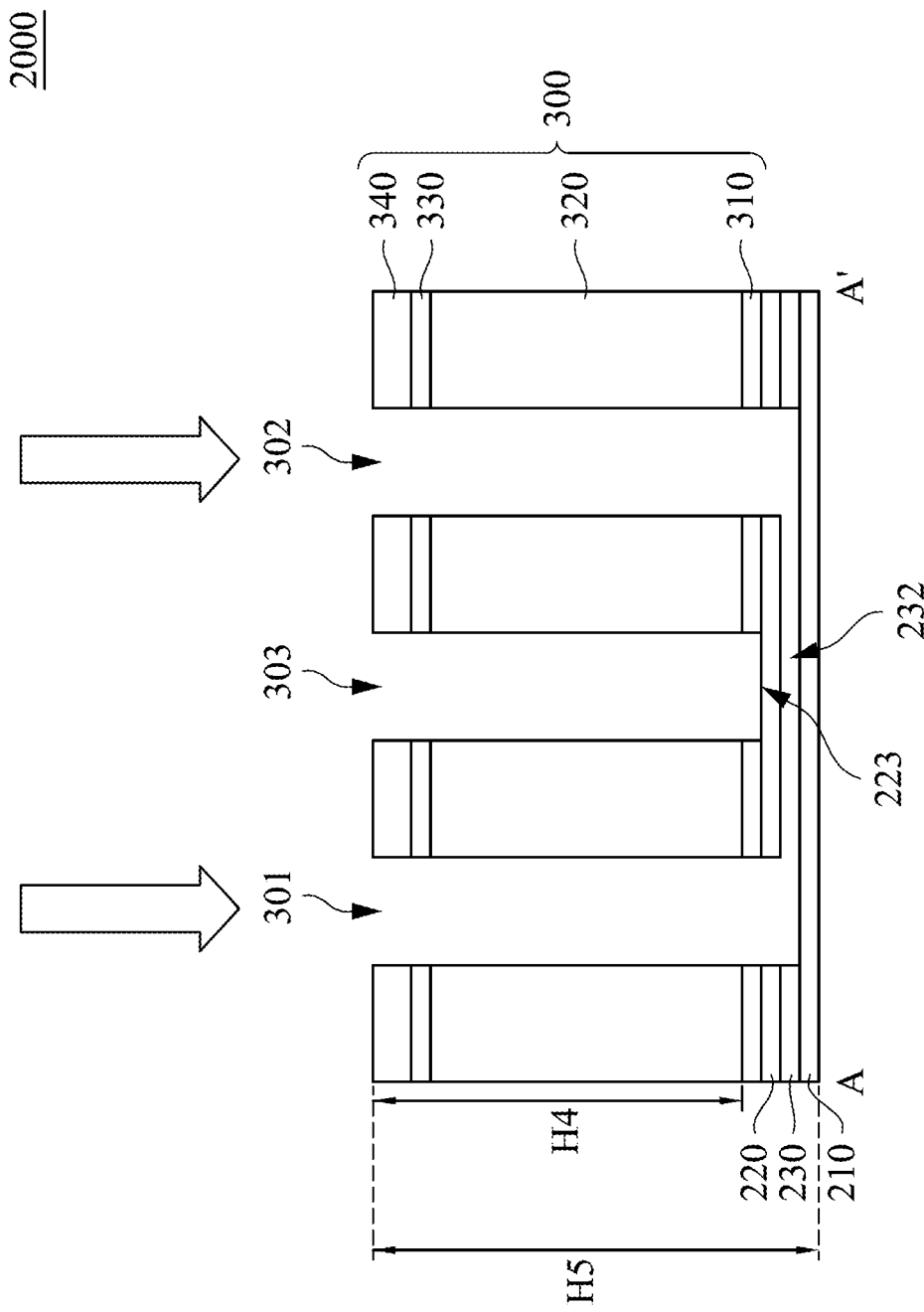
FIG. 16 is a cross-sectional view taken along line A-A of FIG. 15.

FIG. 16 is a cross-sectional view of the transmission electron microscope specimen 2000 taken along line A-A of FIG. 15. The operating method of the transmission electron microscope specimen 2000 will be described below with reference to FIG. 16. As shown in FIG. 16, the first injection hole 301 and the second injection hole 302 communicate with the accommodating space 232, and the viewing window 303 is substantially aligned with the viewing area 223 and the accommodating space 232. In some embodiments, the viewing window 303 can be covered with a vacuum tape to avoid the liquid sample covering the viewing window 303 during injecting to affect the observation. According to some embodiments of the present disclosure, the liquid sample to be tested is then injected from the first injection hole 301 and the second injection hole 302, and is accommodated in the accommodating space 232. The package of the transmission electron microscope specimen 2000 is then completed by simply covering the first injection hole 301 and the second injection hole 302 with an encapsulant. In some embodiments, the encapsulant may include any suitable encapsulant, such as vacuum glue, AB glue or nail polish, but is not limited thereto. After the vacuum tape covering the viewing window 303 is peeled off, the transmission electron microscope specimen 2000 is flipped and placed in a carrier of the electron microscope, such that the liquid sample can be observed by the electron microscope. During the observation, the electron beam will penetrate the first electron-transport layer 210, the liquid sample to be tested in the accommodating space 232, and the second electron-transport layer 220 to be magnified and to form an image thereof.

As described above, according to the present disclosure, a transmission electron microscope specimen and a method of manufacturing the same are provided. The transmission electron microscope specimen of the present disclosure is formed integrally without additional bonding and assembly processes, such that the thickness of the specimen and the package area can be greatly reduced, and sealability can be improved. Moreover, the process of filling and sealing the liquid sample of the transmission electron microscope specimen of the present disclosure is very simple and convenient compared with the conventional specimen, such that the packaging time can be reduced, and the issue of the liquid sample volatilizing during the packaging process, or the reaction rate being too fast to observe can be prevented. The transmission electron microscope specimen of the present disclosure is highly versatile and compatible, and can be suitable for any brand and type of electron microscopes on the market. Moreover, because the thickness of the specimen is reduced, it will not collide with the pole piece of the electron microscope when there is an inclination of a high angle. The transmission electron microscope specimen of the present disclosure accommodates a liquid sample in a space between the layers of $Si_3N_4$ and Si, such that the problem of using Indium to accommodate a liquid sample, which may cause a reaction of the Indium and the liquid sample, can be avoided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A transmission electron microscope specimen, comprising:
    a first electron-transport layer;
    a second electron-transport layer having a first opening, a second opening, and a viewing area, wherein the viewing area is between the first opening and the second opening;
    a spacer layer sandwiched between the first electron-transport layer and the second electron-transport layer, wherein the spacer layer has an accommodating space communicating with the first opening and the second opening; and
    a carrier layer disposed on the second electron-transport layer, and having a viewing window, a first injection hole, and a second injection hole, wherein the viewing window is substantially aligned with the viewing area and the accommodating space, and the first injection hole and the second injection hole respectively communicate with the first opening and the second opening.

2. The transmission electron microscope specimen of claim 1, wherein each of the first electron-transport layer and the second electron-transport layer comprises $Si_3N_4$.

3. The transmission electron microscope specimen of claim 1, wherein each of the first electron-transport layer and the second electron-transport layer has a thickness of about 40-80 nm.

4. The transmission electron microscope specimen of claim 1, wherein the spacer layer comprises silicon (Si).

5. The transmission electron microscope specimen of claim 1, wherein the spacer layer has a thickness of about 50-200 nm.

6. The transmission electron microscope specimen of claim 1, wherein the viewing window has a width of about 50-100 µm and a length of about 50-100 µm.

7. The transmission electron microscope specimen of claim 1, wherein each of the first injection hole and the second injection hole has a length of about 140-200 µm and a width of about 80-100 µm.

8. The transmission electron microscope specimen of claim 1, wherein a distance between the first injection hole and the second injection hole is about 150-750 μm.

9. The transmission electron microscope specimen of claim 1, wherein the transmission electron microscope specimen has a thickness of about 170-600 μm.

10. The transmission electron microscope specimen of claim 1, wherein the carrier layer comprises:
a first etching stop layer disposed on the second electron-transport layer;
a substrate disposed on the first etching stop layer;
a second etching stop layer disposed on the substrate; and
a patterned mask layer disposed on the second etching stop layer, wherein the viewing window, the first injection hole, and the second injection hole penetrate the first etching stop layer, the substrate, the second etching stop layer, and the patterned mask layer.

11. The transmission electron microscope specimen of claim 10, wherein the substrate comprises silicon.

12. The transmission electron microscope specimen of claim 10, wherein each of the first etching stop layer and the second etching stop layer comprises $SiO_2$.

13. A method of manufacturing a transmission electron microscope specimen, comprising:
forming a first etching stop layer on a first surface of a substrate;
forming a first patterned electron-transport membrane on the first etching stop layer, wherein the first patterned electron-transport membrane has a first opening and a second opening exposing the first etching stop layer;
forming a spacer layer on the first patterned electron-transport membrane and covering the first opening and the second opening;
forming a second electron-transport membrane on the spacer layer;
etching the substrate and the first etching stop layer to form a viewing window, a first injection hole, and a second injection hole, wherein the first injection hole and the second injection hole are respectively aligned with and communicate with the first opening and the second opening, and the viewing window is between the first injection hole and the second injection hole; and
etching the spacer layer to form an accommodating space between the first patterned electron-transport membrane and the second electron-transport membrane, wherein the accommodating space communicates with the first injection hole and the second injection hole.

14. The method of claim 13, before etching the substrate and the first etching stop layer, further comprising:
forming a second etching stop layer on a second surface of the substrate, wherein the first surface and the second surface are respectively on opposite sides of the substrate; and
forming a patterned mask layer on the second etching stop layer, wherein the patterned mask layer has a third opening, a fourth opening, and a fifth opening exposing the second etching stop layer, the third opening and the fourth opening are respectively aligned with the second opening and the first opening, and the fifth opening is disposed between the third opening and the fourth opening.

15. The method of claim 14, wherein etching the substrate and the first etching stop layer comprises:
etching the second etching stop layer, the substrate, and the first etching stop layer from the third opening, the fourth opening, and the fifth opening of the patterned mask layer to form the first injection hole, the second injection hole, and the viewing window.

16. The method of claim 13, wherein etching the substrate and the first etching stop layer comprises:
etching the substrate using $C_4F_8$ and $SF_6$; and
etching the first etching stop layer using $CHF_3/O_2$.

17. The method of claim 13, wherein etching the spacer layer comprises:
hydrophilic treating the transmission electron microscope specimen; and
etching the spacer layer through the first injection hole and the second injection hole using KOH to form the accommodating space.

18. The method of claim 13, wherein a distance between the first injection hole and the second injection hole is about 150-750 μm.

* * * * *